(12) United States Patent
Zahn

(10) Patent No.: US 6,436,517 B1
(45) Date of Patent: Aug. 20, 2002

(54) CONTINUOUS MOLDED ELECTRONIC CIRCUITS

(76) Inventor: Irwin Zahn, 10121 Ramas Canyon Rd., San Diego, CA (US) 90121

( * ) Notice: Subject to any disclaimer, the term of this patent is extended or adjusted under 35 U.S.C. 154(b) by 0 days.

(21) Appl. No.: 09/566,855

(22) Filed: May 8, 2000

(51) Int. Cl.⁷ .................................................. B32B 3/00
(52) U.S. Cl. ...................... 428/209; 174/250; 174/254; 174/255; 174/260
(58) Field of Search ......................... 428/209; 174/250, 174/254, 255, 260

(56) References Cited

U.S. PATENT DOCUMENTS

| | | | | |
|---|---|---|---|---|
| 3,537,175 A | * | 11/1970 | Clair et al. ................... | 174/52 |
| 4,281,038 A | * | 7/1981 | Ambros et al. .............. | 428/131 |
| 4,792,532 A | * | 12/1988 | Ohtani et al. ............... | 437/206 |
| 4,916,016 A | * | 4/1990 | Bristowe et al. ......... | 428/411.1 |
| 4,949,155 A | * | 8/1990 | Tajima et al. ................ | 357/68 |
| 5,616,053 A | * | 4/1997 | Bogursky et al. ........... | 439/590 |
| 5,725,392 A | * | 3/1998 | Bianca et al. ............... | 439/590 |
| 5,835,004 A | * | 11/1998 | Gemperle et al. .......... | 338/212 |

* cited by examiner

*Primary Examiner*—Cathy Lam

(57) ABSTRACT

A continuous electrical connector or component strip of plastic or other moldable material serving as substrates and manufactured by injection molding of axial segments in sequence by a scheme providing for interlocking or interconnecting adjacent segments. Into the surface of the plastic or moldable part and tightly bonded thereto is surface-embedded a metal pattern or other metal structure. The metal structure may be metal traces serving as active parts of circuit traces of a printed circuit, with the resultant substrate with metal traces when severed from the strip functioning as a PCB to which may be added electrical components by automatic machinery. The strip can be processed by efficient reel-to-reel techniques.

10 Claims, 4 Drawing Sheets

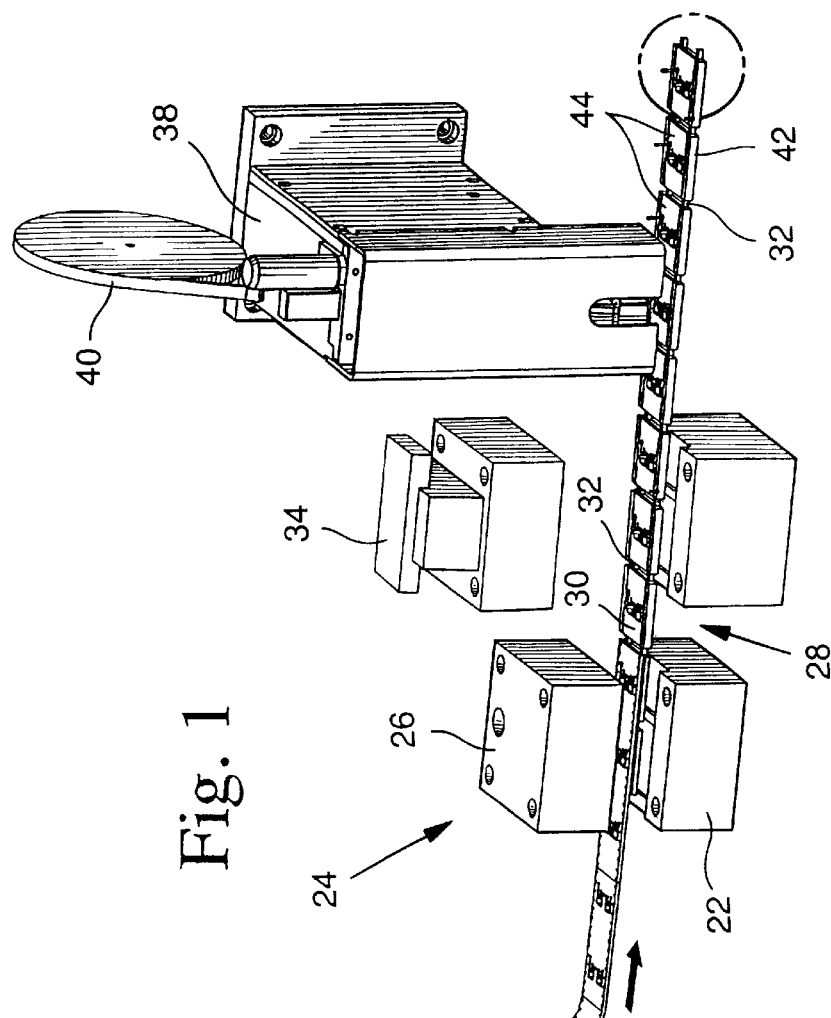
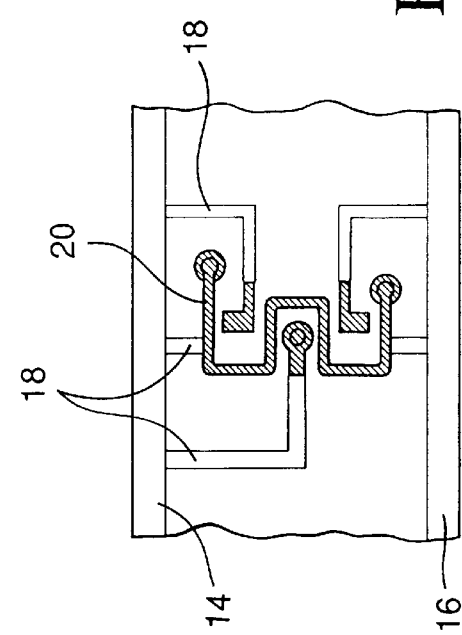

CONTINUOUS MOLDED ELECTRONIC CIRCUITS

BACKGROUND OF THE INVENTION

The invention will be described in the context of the manufacture of printed circuit boards (PCBs) but it will be understood that the invention is not limited to such components and may be applied to the manufacture of other kinds of devices and components useful in the manufacture or assembly of various kinds of electronic components.

PCBs are presently made in individual boards or in small panels that typically contain a series of 4 or more laminated glass fiber boards including putting tinned copper or brass foil on top of the boards, and then removing via photolithography the unwanted portions of metal foil (or alternatively using a photo additive process which keeps only the necessary portions of the ultimate traces desired) leaving behind a metal trace or traces in the desired circuit pattern laminated to the insulating board. This process involves many laminating, masking, developing and etching steps and hence is slow and costly. In addition, PCBs have to be populated with various types of components, i.e., resistors, capacitors, pin terminals, shunts, tab terminals, etc. Populating these boards with these various components, when the boards are in the form of individual or discrete panels, requires expensive conveying equipment, and complex insertion systems. Another limiting feature of present day circuit boards is that they are of necessity flat. However, many devices such as turn indicators on cars or cellular telephones, and some switches, are not flat, but rather are curved and can assume many different shapes.

U.S. Pat. Nos. 5,616,053; 5,725,392; and 5,967,841 describe various schemes for semi-continuously injection molding a strip of material, for example of plastic or of low-melting metals, by a process in which a first segment is molded in a series of axially-aligned cavities in a mold, followed by ejection of the first segment from the mold, indexing of the first segment until a trailing portion having a projecting portion with undercuts or recessed regions can be reinserted into the last mold cavity, and then when the next segment is molded a leading portion of that next segment is molded over and around the reinserted projecting portion to provide a strong interlocking structure substantially in-line with the resultant strip. The process is repeated with subsequent segments forming an elongated continuous strip of the segments. Each of the segments can have particular shapes and configurations for receiving in a later operation pins of a pin header, for example. The patents also describe adding the pins to the mold during the injection molding of each segment, so that the pins are embedded within the body of the segment just as if they had been subsequently inserted into the completed segments. The total contents of all three patents are herewith specifically incorporated by reference into this application.

SUMMARY OF THE INVENTION

An object of the invention is an improved semi-continuous molding process for molding a continuous strip of insulating material with one or more circuit traces surface molded to or surface embedded in a surface of the strip leaving the circuit traces exposed for later receiving assorted electrical components in the conventional way of mounting such components onto a circuit trace of a conventional PCB.

Another object of the invention is a continuous strip of parts or components of injection molded insulating material with surface-embedded metal traces which can be used for any purpose that requires a plastic part for separate use or for assembly into a larger structure.

In accordance with one aspect of the present invention, each segment of the strip is fabricated in a semi-continuous injection molding process as described in the referenced patents. One or more metal circuit traces are then applied to the surface of the segment before or after ejection from the mold such that the metal traces tightly adhere to the underlying insulator by being surface embedded therein. This aspect of the invention is based on the surprising discovery that the metal trace can be caused to tightly adhere to its concurrently-molded or pre-molded substrate and is not easily dislodged and thus the resultant strip of insulating material with spaced circuit traces can be further processed with automatic machinery, and subsequently separated into individual components that are the equivalent of a conventional PCB. This invention takes advantage of the superior efficiency possible from processing mutiple components while supported on or as strips on reel-to-reel automatic machinery, for example, by unreeling the strip, subjecting the strip or traces to a processing step, reeling up the processed strip, and then subjecting the strip to further operations by moving the reel to another machine or while on the same machine. The advantages of reel-to-reel processing has been described in U.S. Pat. No. 5,148,596, whose contents are also incorporated herein by reference.

In accordance with a first preferred embodiment of the invention, a strip of individual circuit traces with active sections interconnected by inactive sections can be separately stamped from a sheet of metal in continuous form, with the individual traces as well as any separated trace sections held together by one or two metal carrier strips adjacent opposite sides of the strip. Next, the carrier-supported metal strip can be implanted directly onto a molded substrate of a semi-continuous molded strip of insulating material parts. This can be accomplished by superimposing the metal strip on top of the bottom mold half containing the cavities for the insulating material parts. The molding operation surface-embeds the overlying metal strip into the just molded underlying insulating material strip. Subsequently, the continuous insulating strip with the embedded circuit traces and the carrier strip or strips can be subsequently processed to separate the individual traces as well as their active sections from their inactive sections.

As a modification of the first preferred embodiment, the metal strip can be implanted directly into the surface of a hot strip of insulating material substrates just after it exits from the mold and while the surface is still soft.

As a further modification of the first preferred embodiment, the strip of insulating material substrates, if allowed to cool after molding, can then be surface heated to soften or melt its surface, followed by the implantation step of the carrier-supported traces directly into the softened substrate surface, with the separation step following as described above.

If desired, the metal strip carriers can be removed by the same operation in which the substrates are separated. If the traces are still left with inactive connecting parts, they can also be removed at the same time from the substrate-supported traces, or in a separate operation.

In accordance with a second preferred embodiment of the invention, a flexible plastic film is provided with metal traces laid out with only the active sections of a sequence of individual trace circuits by any known process or by one of the processes described above. In this film form, the circuits cannot support the usual discrete electronic components such as ICs, resistors, and capacitors. The film is then run through the semi-continuous molding process described above in which interconnected stiffer plastic supports or housings are injection molded in strip form while the plastic film with metal traces is superimposed above the cavities causing the plastic of the film to melt into the plastic of the support or housing forming at the mold exit a strip of interconnected stiffer supports with individual circuit traces surface embedded into the supports. This support strip can then be re-reeled for further component assembly or for further processing or individually-supported circuit traces separated from the strip.

In accordance with a third preferred embodiment of the invention, an insulating material substrate, e.g., for example, of plastic, can be molded in a first stage as a strip of parts interconnected by webs as described above in the first and second preferred embodiments. The molded parts are indexed to a second stage at which is present a metal stamping die which is fed from a continuous reel of tinned brass or copper strip material. The tinned metal enters the stamping die and the stamping operation proceeds which cuts out metal traces including at least the active sections from the metal strip and implants them directly onto the hot (newly exited from the mold) insulating material substrate. The assembly (the plastic plus the metal traces) is then indexed out of the die area, and the process then repeats itself with the next segment. The advantages are that the parts coming out of the mold are in a continuous form, and the end result is a simple, low cost plastic substrate housing with the circuit active traces in final form not requiring any further trace separating steps, or at least reducing the number of further trace separating steps that may be required.

In a preferred embodiment, the axial-projecting portion which is used to form the interlocking section or the connecting tabs has a hole or recess for receiving the overmolded part, with the overmolded part helping to lock the previous segment to the next molded segment in a positive manner.

Preferably, the strip if having interlocking sections is provided with severance means, such as notches or score marks, for severing from the strip a discrete length of the material containing one or more components for any of many uses, such as, for example, as part of a package for various items.

The invention is applicable not only to injection molded insulating plastic materials, but also to other similarly formable materials and processes. Typical insulating plastics such as ABS, PPA, polyesters, polypropylene, and polycarbonates can be used to make insulating parts, as well as silicone rubber materials. The formable material can also include fibers for reinforcement, such as glass fibers. Thus, the terms "molded", "injection-molded", "moldable", or "molding" as used herein should be understood in the broadest sense to include not only injection molding of plastics but also of other formable materials.

The semi-continuous molded PCB assembly process described here has many benefits. It's economical in that the stamped metal traces can be implanted in the insulating material substrate at the same time that the insulating material substrate is molded or at a second stage temporally close to the semi-continuous molding step. It's also much easier to populate the continuous molded assemblies with components while they are in the continuous reeled form because it eliminates the handling of individual PCBs, and facilitates the automation of the component insertion.

An additional benefit, when the assembly is in continuous form, is that after the boards are populated (while in continuous form) they can be re-reeled, then subsequently automatically inserted into either a plastic housing or into a motherboard. There are many instances when daughter boards are inserted into motherboards (as in radios, TV's, computers, etc.) and with the assemblies in reeled form then it would be easier to automate their insertion into the housing or the motherboard.

These and other objects and attainments together with a fuller understanding of the invention will become apparent and appreciated by referring to the following descriptions and claims taken in conjunction with the accompanying drawings which illustrate by way of example and not limitation preferred embodiments of the invention and wherein like reference numerals denote like or corresponding parts.

SUMMARY OF THE DRAWINGS

In the drawings:

FIG. 1 is a perspective schematic view illustrating one way of carrying out one embodiment of the invention;

FIG. 2 is a plan view taken from the top of the metal strip of FIG. 1 after the stamping operation and before the molding operation;

DETAILED DESCRIPTION OF PREFERRED EMBODIMENTS

Figure 3:
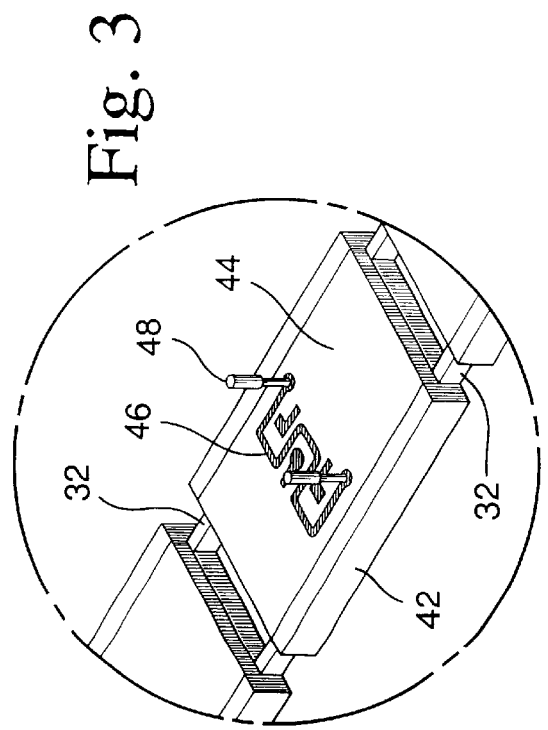
FIG. 3 is a perspective view of the insulating material supported traces of FIG. 1 after removal of the carriers and inactive trace connections and after populating with pin components.

The semi-continuous injection molding process has been completely described in the first three patents referenced above and incorporated herein and there is no reason to repeat the details already described therein. If such details are desired, the reader is directed to the patents themselves. However a brief summary will now be provided for a better understanding of the contribution of the present invention.

A typical injection mold for plastic material is divided into 2 halves, with a mold top which seals off the mold cavities in the bottom half The cavities have the configuration to mold a single segment with the one or two cavities at the forward end for receiving the previously molded segment unit next to the previously molded trailing end unit and for overmolding over that end unit the leading end unit of the next segment to form the interlocking section or connecting links, and a cavity at the trailing end for molding the trailing end unit of the next segment. After each molding cycle, when the mold halves are separated, ejector means will free the just-molded segment, so it can be advanced to free up the mold for the next cycle. During the molding process, inert core pins may be positioned in each cavity where a hole is to be formed in a molded unit. It will be understood that, for the present invention, a strong interlocking section may not be necessary, and the overmolded units can be formed by simple tabs which interconnect each of the molded segments. Similarly, the connecting pieces interconnecting each of the individual units in each segment can also be replaced by simple tabs to obtain the desired continuous strip. Notchings may be provided to assist in the later separating step. After the mold halves are separated, the discretely molded previous segment is ejected from the mold cavity and indexed by a mechanism such as motor driven gears to the proper position for the next molding cycle. The next cycle of the mold again fills the cavities with molten plastic, and encapsulates the trailing end unit inside the overmolded part of the next segment.

In this first embodiment, a metal stamping die at a first station (not shown) is fed from a continuous reel (not shown) of a tinned metal strip, for example, of brass or copper. The metal strip enters the die and the stamping process proceeds to stamp (cutout) in a conventional manner longitudinally-spaced trace patterns from the strip, the individual trace patterns being supported from one or two continuous carrier strips extending along the sides. The continuous strip of carrier-supported traces can then be reeled up, and the reel 10 moved to a second station that contains an injection mold of the type described in the referenced applications. FIG. 1 shows the second station with the reel 10 with its continuous strip 12 of stamped metal traces, a plan view of which is shown in FIG. 2. The strip comprises oppositely-disposed carrier strips 14, 16 which via inactive connecting pieces 18 support the active trace portions 20. The latter have been hatched to distinguish them from the inactive parts. The terms "inactive" and "active" mean that the active parts are part of the finished printed circuit, whereas the inactive parts, which will later be removed, merely serve to support the active parts on the carriers 14, 16. A process is then carried out to semi-continuously injection mold a continuous strip of plastic substrates held together by molded interlocking ends or tabs. Again, the continuous strip of plastic substrates can then be reeled up, and the reel moved to a third station where trace sections of the carrier-supported traces are surface-embedded into respective substrates of the strip of plastic substrates. The surface embedding can occur in several different ways.

A first way is to locate the second station adjacent to and in line with the output of the third station, and to coordinate their respective operations so that as the just molded plastic segments are indexed out of the mold and while still hot, a section of the trace strip is fed on top of the still hot plastic segment and pressed into its hot surface. When cooled, the trace strip will be tightly adherent to the underlying substrate. The pressing operation can at the same time sever the metal carrier strip or strips leaving the individual trace patterns surface embedded in the strip of plastic, which can then be reeled up for subsequent processing.

A second way which is a modification of the first is to allow the two stations to operate independently, producing a strip of carrier-supported traces and a strip of plastic substrates. Then, the strip of plastic substrates is passed under an infrared heater which is sufficient to surface melt the surface of the plastic strip, and while the latter is hot and soft the strip of carrier-supported traces is superimposed and pressed into the plastic surface as described in the first way. Essentially, this is a combination of a plastic injection mold, together with a metal stamping die.

A third way, which is preferred, is illustrated in FIG. 1. The strip 12 of supported traces is indexed over the bottom half 22 of an injection mold 24 which contains a plurality of cavities (not shown) for receiving injected hot plastic. The cavities underlie the metal strip 12. When the top half 26 of the mold closes over the metal strip 12, the latter is held adjacent the cavities and the injection of hot plastic causes that portion of the metal strip to be surface embedded in the resultant underlying plastic strip 28 which comprises substrates 30 interconnected by plastic tabs 32. The resultant strip 28 is then fed through a conventional die cutting device 34 which separates each of the traces from their supporting carriers 14, 16 and also cuts out the inactive portions 18 of the traces which are now in their final desired pattern ready to receive components. In the next stage is a conventional device or machine 38 for placing components supplied from a reel 40 of continuously fed components onto the traces on each of the linked insulating material substrates 30. The resultant product is a strip 42 of interconnected substrates 44 with trace patterns 46 containing suitable components, in this particular case, the components are connector pins 48. FIG. 3 is an enlarged view of the circled part of the strip shown in FIG. 1.

This first embodiment can result in the trace sections being made independent when the carriers are severed. If undesired connections still remain, they can be removed in a separate step by one of the ways described below in connection with the second embodiment. The key point is that reel-to-reel processing is employed with all the advantages flowing from that efficient procedure. The resultant strip of now-separated trace sections each supported on a substrate populated with the electric components desired can now be reeled up and distributed to an equipment maker, or be separated by severing the links 32. When severed from the strip, a series of individual PCBs have been created that can be assembled onto larger boards. While typical substrates would have some stiffness for easier handling and would be flat as the conventional PCB, this is not essential. A further advantage is that the substrate can be thinner and flexible with the result that it can be curved or shaped to fit within the small space of a small device, such as a cell phone or other hand-held device.

Figure 4:
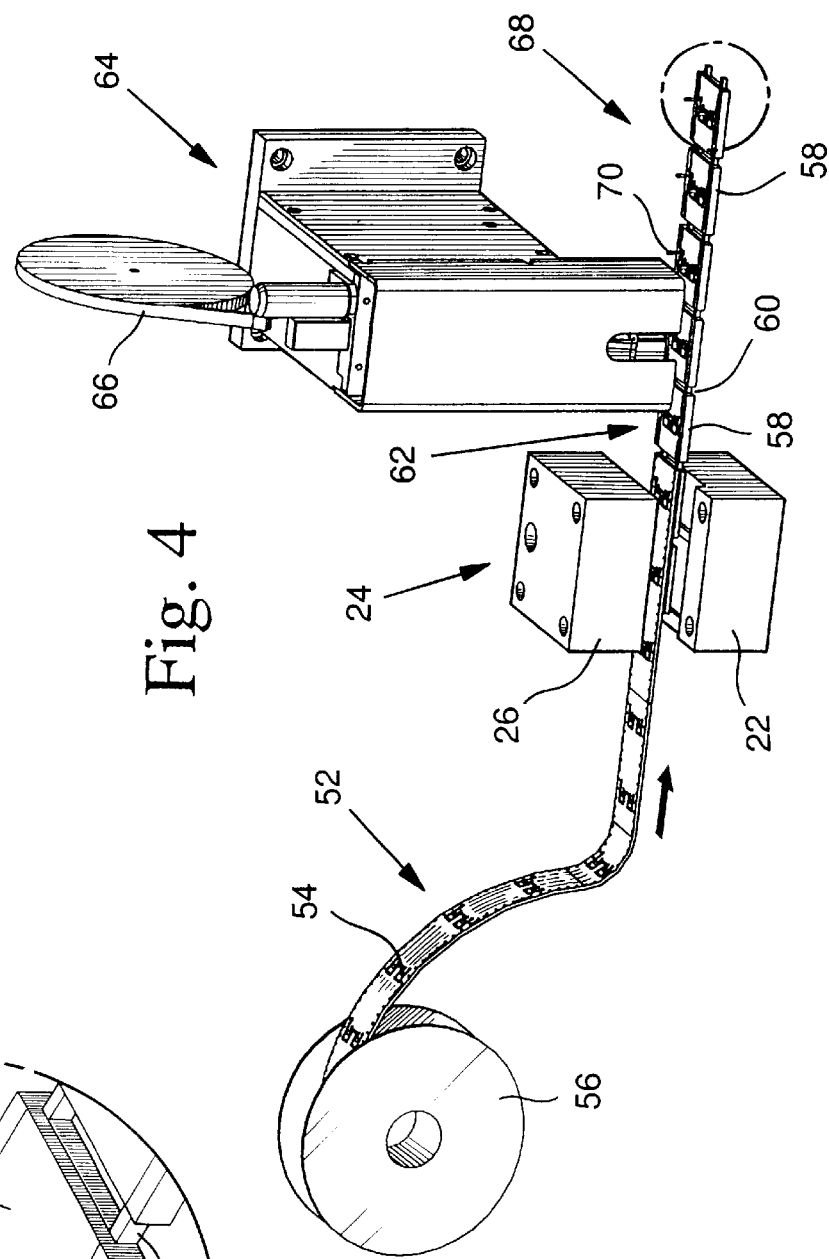
FIG. 4 is a perspective schematic view illustrating one way of carrying out another embodiment of the invention.

In a second embodiment now described, FIG. 4 shows an elongated plastic film carrier strip 52 with metal tracks 54 supplied from a reel 56 that is being run through an injection molding machine 26 symbolized by the mold halves 22, 26. The plastic film 52 can be, for example, of polypropylene or MYLAR. It can be the same material as that of the substrate to be molded to which it will be attached as by melting into the substrate, or it can be of a plastic different from that of the substrate to which it can also attach as by melting or form an adhesive attachment in another way. For example, MYLAR will melt into polypropylene. The metal tracks 54 can be applied to the film carrier 52 by any known method, such as by vapor deposition through a mask or by known lithographic techniques, except that the individual active parts of the circuit need not be pre-separated on the film. Alternatively, the metal tracks can be applied to a wide film sheet laid out in an orthogonal pattern, and the sheet cut into individual strips. In either case, after the carrier strip 52 is formed, it is reeled up and supplied as the reel 56 in FIG. 4. Plastic housings or supports 58 are molded in the mold 24 by the semi-continuous molding process described above, with a molded web or tabs 60 connecting together the several plastic housings 58. The housing parts 58 are molded while the strip 52 with its metal traces 54 is in the mold between the top half 26 and the mold cavities in the bottom half 22. During the molding step, the film 52 melts into the subtrate material 58 when it is injected into the closed mold. In other words, this molding step molds each housing to the underside of the film carrier under each of the traces and simultaneously removes film material between the housings 58 as scrap. As the assembly 62 exits from the mold 24, each trace 54 is now firmly bonded to an underlying substrate 58 which is stiffer and sturdier than the film. Each of the housings or substrates are connected together by the molded tabs 60 to form the continuous strip 62. After the parts have finished cooling down, the strip 62 is indexed to the next stage which provides a conventional insertion machine 64 which places electronic components supplied from a reel 66 onto the metal traces in the usual way. The resultant continuous strip 68 divided into interconnected housings 58 each containing a metal trace 54 and an inserted component, for example, a connector pin 70 or post, can then be re-reeled (not shown) and the reel taken to another machine for further processing. It will be understood that further processing includes, for example, wave soldering to permanently attach the components to the PCB traces, in which case a high-temperature plastic is preferred.

Figure 6:
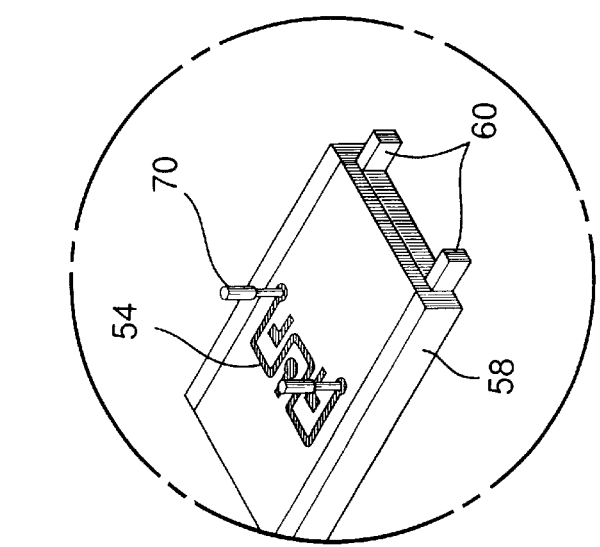
FIG. 6 is a perspective view of the insulating material supported traces of FIG. 4 after removal of the carriers and inactive trace connections and after populating with pin components.
Figure 5:
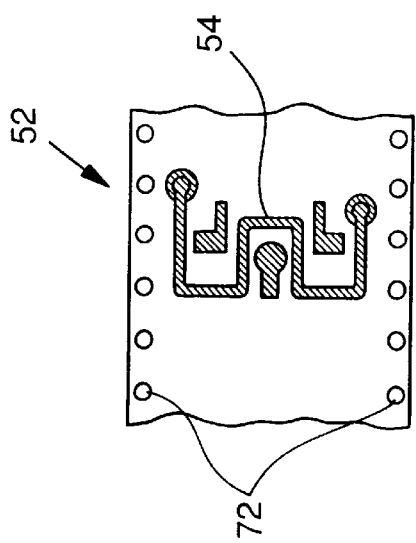
FIG. 5 is a plan view taken from the top of the film strip of FIG. 4 with spaced traces before the molding operation.

FIG. 5 shows an enlarged plan view of the part of the film carrier 52 with a metal trace 54 thereon, as well as indexing holes 72 along the sides for indexing the strip. FIG. 6 is a perspective enlarged view of the circled part of the strip of FIG. 4 showing the housing 58 with a trace 54 and pin components 70 in place. The connecting molded tabs 60 can be severed at a later stage in this process.

If the traces were already separated into their active parts, nothing further has to be done to the part except to assemble it into a larger structure if desired. But, if the traces were not pre-separated, then the strip 68 of housings would have to be subjected to a further stage to so-to-speak customize the traces. There are several ways in which this can be done using reel-to-reel processing. One way is to employ a stamping power press that punches out any connecting inactive trace pieces which can go right through the film into the substrate. Another way is to use a computer controlled laser that can easily cut out the inactive connecting trace pieces. A third way is to use a high pressure water knife for cutting out the undesired connecting pieces. Still another way is to use a known subtractive process using a masking method together with an acid bath for cutting out the connecting pieces. As still a further alternative, the individual traces could have been supported by an outside metal carrier or two carriers and the carrier arms supporting the individual traces then severed to provide the desired separation.

As a variant of this second embodiment, two separate reels containing film strips, each similar to that of FIG. 4, can be supplied to a mold divided into 3 parts, with the mold cavities located in the middle part. One film strip is supplied between the top mold part and the middle mold part, and the other film strip is supplied between the bottom mold part and the middle mold part. During the molding step, the top and bottom film strips will be melted into the top and bottom substrate surfaces, respectively, with the result that the substrate will have adherent metal traces on both of its major surfaces. The resultant strip of substrates can be processsed in the same manner as the second embodiment, to then populate both sides of the substrates with components.

Figure 7:
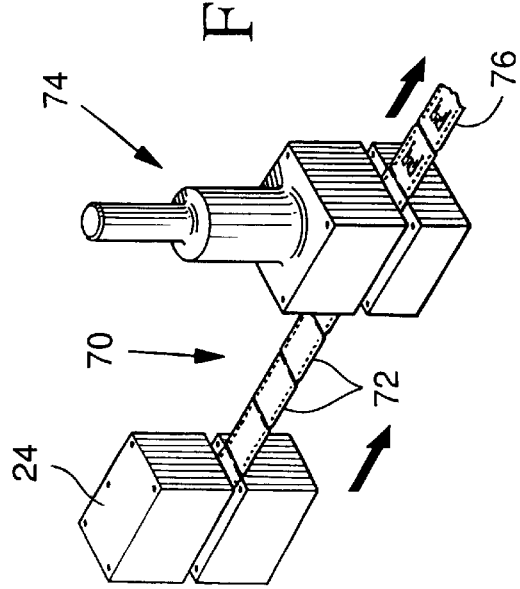
FIG. 7 is a perspective schematic view illustrating one way of carrying out still another embodiment of the invention.

FIG. 7 briefly illustrates a third embodiment of the invention. In this embodiment, at a mold 24 is fabricated a strip 70 of interconnected insulating material substrates 72 as described in the referenced patents. The strip 70 is then passed through a downstream stage 74 which provides trace patterns 76 surface embedded into the surface of each of the substrates 72. This can be done in several ways. In a first way, the stage 74 is an embossing machine which is fed with a strip of tinned metal conductor (not shown). The embossing machine 74 in a known way stamps out of the metal strip trace patterns and presses them each with high pressure into the surface of each of the substrates 72 of the strip 70 as it passes through the machine 74. The pressure is sufficient to implant the cut-out metal into the plastic surface producing raised conductive traces typical of an ordinary embossment. The resultant strip 76 can then be populated with components in the normal manner.

In a second way, the machine 74 can be an offset printing machine or an ink jet printer which deposits conductive ink, for example, of silver, in the pattern of the desired traces on each of the substrates. The ink, when dried, will adhere will adhere to the substrates. To increase the bonding strength, which also can be used with the other embodiments, an adhesive layer can be applied to the surface of the substrates before applying the ink. Roughening the surfaces will also enhance adhesion. Components can then be added in the usual way. It will be understood that the term "surface embedding" is meant to include implanting the metal into the surface, so that it is partly buried, but with the surface exposed to receive the components, as well as a surface deposit that is tightly adherent to the substrate.

Figure 10:
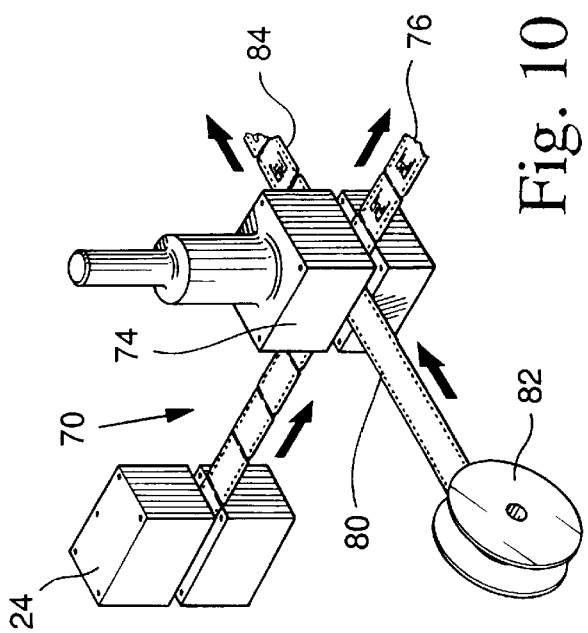
FIG. 10 shows another variant.

FIG. 10 briefly illustrates the first way, in which the embossing machine is supplied with a metal strip 80 from a reel 82. The metal strip 80 passes over the substrate strip 70, during which the embossing machine stamps out a desired trace and presses it and surface embeds it into one of the substrates. The scrap left over exits at 84. The desired metal-embossed end product is shown at 76.

Figure 9:
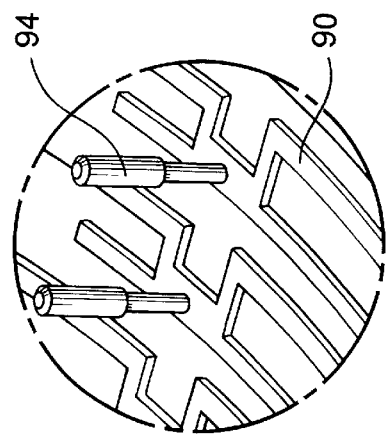
FIG. 9 is a detail view of part of a cell telphone.
Figure 8:
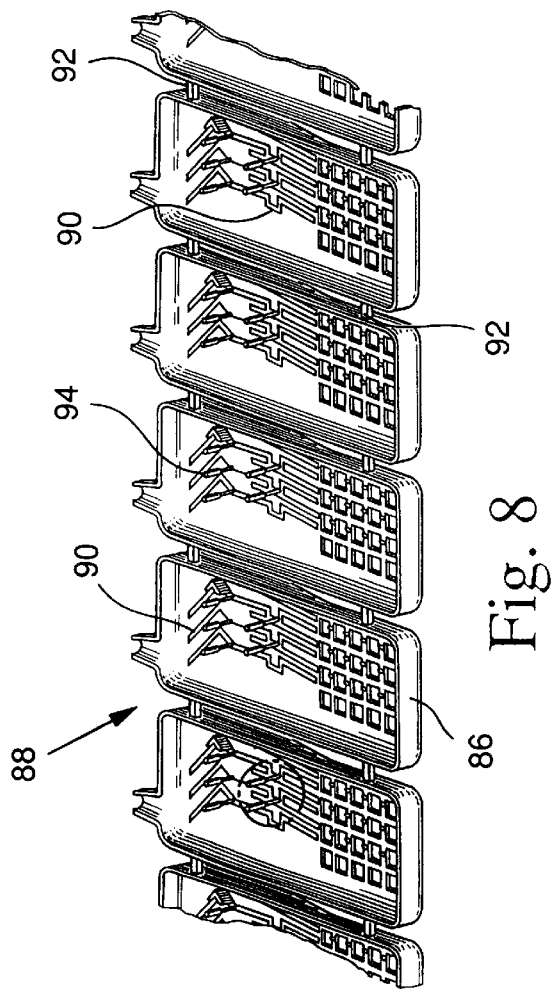
FIG. 8 is a schematic perspective view of a strip of cell telephone housings made by a process according to the invention.

As mentioned, a feature is the ability to fabricate curved PCBs. FIG. 8 shows a strip of cell telephone housings 86, each of plastic, and fabricated as a strip 88 linked together by connecting tabs 92 by the semi-continuous molding process. During or after the plastic strip 88 is finished, metal traces 90 are surface embedded into the concave curved inner surface of the housings 86 by one of the inventive processes described above. FIG. 9 is a detail view of the circled part of FIG. 8, with the items designated 94 being pin components mounted or soldered to the embedded traces 90.

The number of units provided in each segment is not critical. It can vary from 3 to more than 50, depending on mold and part size. A typical value would be about-8–12-units with a pitch of about 1.7- inches, with a material width of about 0.7 inches and with a material length of about 1.7 inches.

The use of semi-continuous injection molding offers several advantages over extrusion. Holes if desired may be molded directly. Higher-temperature plastics can be used. Greater dimensional accuracy is possible. Pitch is more consistent. The parts are cleaner since no plastic need be removed as is required for extrusion. Also secondary machining or punching operations necessary with extrusions are eliminated.

A disadvantage of the tab or interlocking means for linking the plastic substrates is that when the process is completed scrap is left behind in the form of the tabs that must be disposed of If this is undesired, then the method described in one of the referenced patents wherein the leading section of the next segment is incorporated into the trailing section of the previous segment with no visible connecting link present can be substituted. Then, when the segments are severed, no excess material is left behind. As in the other embodiments, the resultant strip of molded components may, if desired, be reeled up on a reel which can be mounted on known automatic process machines equipped with a feeding device for separating individual parts from the strip and feeding them to the assembly support section.

While the invention has been described in conjunction with specific embodiments, it will be evident to those skilled in the art that many alternatives, modifications and variations will be apparent in light of the foregoing description. Accordingly, the invention is intended to embrace all such alternatives, modifications and variations as fall within the spirit and scope of the appended claims.

What is claimed is:

1. A continuous elongated injection-molded strip of moldable material containing a plurality of spaced approximately in-line metal trace patterns with or without mounted components along substantially the length of said strip, comprising:

(a) a consecutive series of injection-molded segments of moldable material, (b) each segment comprising a consecutive series of connected integral components comprised of first leading and second trailing end units and a plurality of middle units between the end units, said middle units each being of moldable material and separated along their length from each other, (c) except for the end segments, one of the first and second end units of each segment having a portion overmolding a projecting portion of the other of the first and second end units of the adjacent segment whereby successive segments are integrally coupled by their respective overmolded and projecting portions of the second and first end units, (d) longitudinally-spaced metal trace patterns surface embedded in and tightly adherent to the surface of each of the units, with their respective surfaces exposed for mounting of components.

2. The strip of claim 1, further comprising a reel, said elongated strip of insulating material being wound up on the reel.

3. The strip of claim 1, wherein the moldable material is plastic and the metal traces are tinned copper or brass.

4. The strip of claim 1, wherein the units are separated by severance means or tabs.

5. A continuous elongated injection-molded strip of moldable material containing a plurality of spaced approximately in-line metal traces surface-embedded into the surface of the strip along substantially the length of said strip, comprising:

(a) a consecutive series of injection-molded segments of moldable material, (b) each segment comprising a consecutive series of connected integral components comprised of first leading and second trailing end units and a plurality of middle units between the end units, said middle units each being of moldable material and separated along their length from each other, (c) except for the end segments, one of the first and second end units of each segment having a portion overmolding a projecting portion of the other of the first and second end units of the adjacent segment whereby successive segments are integrally coupled by their respective overmolded and projecting portions of the second and first end units, (d) spaced metal traces surface-embedded into the surface of the strip and having their outside surface exposed for receiving objects.

6. The strip of claim 5, wherein the units are separated by severance means.

7. The strip of claim 5, wherein the moldable material is of plastic.

8. The strip of claim 5, further comprising a reel, said elongated strip of material being wound up on the reel.

9. The strip of claim 5, further comprising plural components assembled on and in contact with surface embedded metal traces.

10. The strip of claim 5, wherein the units have curved surfaces into which the traces are surface embedded.

* * * * *

UNITED STATES PATENT AND TRADEMARK OFFICE
CERTIFICATE OF CORRECTION

PATENT NO. : 6,436,517 B1
DATED : August 20, 2002
INVENTOR(S) : Irwin Zahn

It is certified that error appears in the above-identified patent and that said Letters Patent is hereby corrected as shown below:

<u>Title page,</u>
Item [76], the inventor's address should be:
-- 1750 Avd. Del Mundo (#1003), Coronado, CA 92118 --

Signed and Sealed this

Thirty-first Day of December, 2002

JAMES E. ROGAN
*Director of the United States Patent and Trademark Office*